(12) United States Patent
Dusha

(10) Patent No.: US 10,698,042 B2
(45) Date of Patent: Jun. 30, 2020

(54) MAGNETOMETER COMPENSATION

(71) Applicant: LEICA GEOSYSTEMS AG, Heerbrugg (CH)

(72) Inventor: Damien Dusha, Dutton Park (AU)

(73) Assignee: LEICA GEOSYSTEMS AG, Heerbrugg (CH)

( * ) Notice: Subject to any disclaimer, the term of this patent is extended or adjusted under 35 U.S.C. 154(b) by 49 days.

(21) Appl. No.: 15/566,295

(22) PCT Filed: Apr. 13, 2016

(86) PCT No.: PCT/AU2016/050271
§ 371 (c)(1),
(2) Date: Oct. 13, 2017

(87) PCT Pub. No.: WO2016/164976
PCT Pub. Date: Oct. 20, 2016

(65) Prior Publication Data
US 2018/0299513 A1 Oct. 18, 2018

(30) Foreign Application Priority Data
Apr. 13, 2015 (AU) .................. 2015901312

(51) Int. Cl.
*G01R 33/00* (2006.01)
*G01C 17/38* (2006.01)
(Continued)

(52) U.S. Cl.
CPC .......... *G01R 33/0035* (2013.01); *E02F 3/435* (2013.01); *E02F 9/264* (2013.01);
(Continued)

(58) Field of Classification Search
CPC ........ G01R 33/35; G01R 33/17; G01R 33/25; E02F 3/435
See application file for complete search history.

(56) References Cited

U.S. PATENT DOCUMENTS 5,095,631 A * 3/1992 Gavril .................... G01C 17/38
33/333
5,387,863 A * 2/1995 Lo .......................... G01B 7/004
324/207.13

(Continued)

FOREIGN PATENT DOCUMENTS

EP 0 436 794 A1 7/1991

OTHER PUBLICATIONS

Extended European Search Report dated Nov. 21, 2018 as received in Application No. 16779336.3.
(Continued)

*Primary Examiner* — Dominic E Hawkins
(74) *Attorney, Agent, or Firm* — Maschoff Brennan

(57) ABSTRACT

A system and method that compensates for local disturbances in magnetometer measurements for working equipment. For example, compensating for magnetometer disturbances caused by a stick, boom, and bucket of an excavator. The compensation is performed by generating or obtaining a magnetic model of movable members, determining the position of each of the movable members, calculating an estimated magnetic disturbance, and modifying the magnetometer measurement.

17 Claims, 4 Drawing Sheets

(51) Int. Cl.
E02F 3/43 (2006.01)
E02F 9/26 (2006.01)
G01R 33/025 (2006.01)

(52) U.S. Cl.
CPC ......... *G01C 17/38* (2013.01); *G01R 33/0017* (2013.01); *G01R 33/025* (2013.01)

(56) References Cited

U.S. PATENT DOCUMENTS

| | | | |
|---|---|---|---|
| 5,444,669 A * | 8/1995 | Polvani | F41G 9/008 367/96 |
| 7,451,549 B1 * | 11/2008 | Sodhi | G01C 17/38 33/356 |
| 7,932,718 B1 | 4/2011 | Wiegert | |
| 8,620,610 B2 | 12/2013 | Bageshwar et al. | |
| 2004/0123474 A1 * | 7/2004 | Manfred | G01C 17/38 33/352 |
| 2005/0197755 A1 * | 9/2005 | Knowlton | E02F 9/2037 701/50 |
| 2007/0101596 A1 * | 5/2007 | Olson | G01C 17/38 33/356 |
| 2010/0141261 A1 * | 6/2010 | Overby | G01V 3/12 324/329 |
| 2012/0101772 A1 * | 4/2012 | Frassati | G01D 5/142 702/150 |
| 2012/0116725 A1 * | 5/2012 | Klinkenbusch | G01R 29/10 702/189 |
| 2012/0245874 A1 * | 9/2012 | Cain | G01C 17/02 702/92 |
| 2012/0271582 A1 * | 10/2012 | Bageshwar | B66C 13/46 702/92 |
| 2014/0084926 A1 | 3/2014 | Amthor et al. | |
| 2015/0369950 A1 * | 12/2015 | Wu | G01V 3/38 702/7 |
| 2016/0091317 A1 * | 3/2016 | Friend | G01C 21/165 701/500 |

OTHER PUBLICATIONS

Antonio Villalba Madrid, et al. (Aug. 3, 2012). "Process for Compensating Local Magnetic Perturbations on Ferromagnetic Surfaces". Journal of Electormagnetic Analysis and Applications, 2012, vol. 4, p. 387-399.

Johan Gustafsson. (2014). "Orientation estimation of a rigid multi body system using accelerometers, gyroscopes and the geometry". Master's Thesis in System, control and mechatronics from Chalmers University of Technology. Gothenburg, Sweden.

Yang Yun-tao, et al. (Dec. 2008). "A Magnetic Disturbance Compensation Method Based on Magnetic Dipole Magnetic Field Distributing Theory". Acta Armamentarii, vol. 29, No. 12, Dec. 4, 2008. Acces via German National Library of Science and Technology to IP Australia Library.

* cited by examiner

MAGNETOMETER COMPENSATION

FIELD OF THE INVENTION

The invention relates to magnetometer compensation. In particular, the invention relates, but is not limited, to compensating magnetometer measurements for variances due to local magnetic fields such as, for example, from ferrous components of working equipment.

BACKGROUND TO THE INVENTION

Reference to background art herein is not to be construed as an admission that such art constitutes common general knowledge.

Magnetometers are used frequently in many applications to measure the strength and direction of the magnetic field of the Earth. By aligning a magnetometer measurement with magnetic north, the heading of a device may be determined.

Modern integrated circuit-based magnetometers capable of resolving heading to under 0.1° can be constructed at a relatively low cost. For this reason, magnetometers have been employed outside of traditional navigation uses, such as in relation to machine control.

The weak nature of the Earth's magnetic field means that the heading computed from a magnetometer measurement may be easily influenced by disturbances to the Earth's magnetic field. These disturbances may be caused by magnets, ferrous metal objects, and/or electric currents, including those from a vehicle on which a sensor may be mounted.

Anomalies induced by ferrous objects may be classified into 'hard iron' errors and 'soft iron' errors. Hard iron errors are permanent magnetic effects, which are independent of any externally applied magnetic field. Soft iron errors arise due to the induced magnetism caused by an externally applied magnetic field. Generally, hard iron effects appear as a fixed offset on a magnetometer measurement as the object on which said magnetometer is attached is rotated. In contrast, soft iron effects cause a distortion proportional to the externally applied magnetic field.

A variety of techniques have been employed to minimise magnetic field measurement corruption influenced by such disturbances. For example, a shipmaster can calibrate a ship's compass by using carefully placed magnets that compensate for the magnetic field effects of the hull of the ship and any payload, such as steel shipping containers.

Similarly, it is known to calibrate a magnetometer by fitting an ellipse or ellipsoid to the locus of measurements taken by the sensor. The combination of hard iron and soft iron magnetic effects distorts the locus of measurement points taken from a magnetometer from a sphere to an ellipsoid centred away from the origin.

The ellipsoidal model implicitly assumes that the ferrous object is at a fixed position and rotation relative to a sensor frame attached to the magnetometer. This model has shown to be a good approximation for a conventional land vehicle where there are few (if any) independently moveable ferrous parts large enough to cause a measurable effect.

In many applications, however, there are independently moveable ferrous parts large enough to cause a measurable effect present. For example, in an excavator, the boom, bucket, and stick can all cause noticeable deviations in magnetometer based heading estimates, depending on the location and orientation of these movable ferrous members. Similar effects may be observed in other working equipment, such as backhoes, dozers, graders, front-end loaders, snow groomers, backhoes, drills, tractors with towed implements, tanks with movable turrets, and other heavy duty machinery.

In the case of civil construction and mining machinery, it is often particularly desirable to determine the precise location of a working edge, such as the lip of an excavator bucket. This may be determined using spatial locations and/or angles of mechanical linkages, such as the boom, bucket, and stick of an excavator.

Measurements of spatial locations and/or angles of mechanical linkages can be exploited to compensate for the magnetic deviations caused by the movement of the mechanical linkages. One approach is to map magnetic anomaly as a function of relative positions and/or angles of the linkages. While reasonably effective for relatively simple movement parameters, such as for a rotating tank turret, it is not practical to map all possible positions of multiple linkages with dependant motion as arises in, for example, an excavator arm. This issue is exacerbated for equipment which has interchangeable components, such as an excavator with different working implements.

Any magnetometer measurement disturbance caused by movement of ferrous members or the like, such as the arm of an excavator, is obviously undesirable as it can introduce heading deviation errors and result in incorrect position determinations. It may be possible to overcome these magnetometer measurement disturbances by using non-magnetic heading systems. However, such systems may not always be suitable and are considerably more expensive than magnetometer based systems, making them less commercially viable or even commercially unfeasible in many applications.

OBJECT OF THE INVENTION

It is an aim of this invention to provide magnetometer compensation which overcomes or ameliorates one or more of the disadvantages or problems described above, or which at least provides a useful alternative.

Other preferred objects of the present invention will become apparent from the following description.

SUMMARY OF INVENTION

In one form, although it need not be the only or indeed the broadest form, there is provided a method of providing calibration or compensation for a magnetometer located on working equipment, the method comprising:
 identifying one or more members of the working equipment that are movable relative to the magnetometer;
 obtaining a magnetic model of each identified members;
 determining the relative position of each identified member;
 taking a magnetometer measurement;
 calculating an estimated magnetic disturbance caused by the one or more members using the magnetic model and relative position of each identified member; and
 modifying the magnetometer measurement according to the estimated magnetic disturbance.

Preferably the magnetic model is a magnetic dipole model. Preferably the step of obtaining a magnetic model comprises modelling each identified member as one or more magnetic dipoles.

Preferably the magnetometer is located on a chassis and the one or more members of the working equipment that are movable relative to the magnetometer are movable relative to the chassis. Preferably the chassis is a vehicle chassis.

Preferably at least some of the identified members are made of a magnetic material. At least some of the members may also, or instead, include electromagnetic components. At least some of the members may be ferrous members. In a preferred form, the members include a boom, stick, and/or bucket of an excavator arm. Addition or alternative members may be included, such as a further boom and/or a rototilt bucket.

Preferably the step of modelling each identified member as one or more magnetic dipoles comprises modelling each identified member as an array of dipoles. Preferably the array is one, two, or three dimensional. Preferably each array is at least two dimensional. In a preferred form each member is modelled as a two dimensional array of magnetic dipoles. The size and/or dimension of each array may vary relative to the others. The spacing between dipoles within an array may vary. Preferably the array of dipoles is aligned along a reference axis relative to the identified member. Preferably the reference axis corresponds to a longitudinal or major axis of the member. The reference axis may be selected to maximise the number of elements of an array that correspond to a position of the member.

Preferably the size of the array of magnetic dipoles for each member is determined to prevent under-fitting or over-fitting. The method may further comprise the step of determining the fitting of each array. The step of determining the fitting of each array may comprise examining a covariance matrix of a recursive least-squares formulation of an array. The method may further comprise increasing the number of elements in the array if under-fitting is determined. The method may further comprise decreasing the number of elements in the array if over-fitting is determined.

Preferably each element of an array relates to a co-ordinate of the corresponding member of that array. Preferably the elements of each array correspond to evenly spaced co-ordinates of the corresponding member. Preferably each dipole has a fixed displacement relative to the co-ordinates of its member. Preferably the step of determining the relative position of each identified member comprises determining the relative position of each dipole of the identified member.

The step of modelling each identified member as one or more magnetic dipoles preferably comprises estimating a magnetic flux density of each magnetic dipole. The step of modelling each identified member as one or more magnetic dipoles preferably comprises estimating a magnetic moment of each magnetic dipole. Preferably the step of modelling each identified member as an array of dipoles comprises estimating a magnetic moment for each dipole element of the array. Each array may contain zero, or one or more elements with a magnetic moment of zero. Any zero magnetic moment elements may be disregarded.

Preferably once an identified member has been modelled as one or more magnetic dipoles, a model for that member is stored. Preferably the model is stored electronically. The model may be transmitted to a remote storage database. The method may further comprise the step of storing a model of an identified member, preferably together with an identifying element that corresponds to that member. The method may further comprise retrieving a model of an identified member. The model may be retrieved from a remote storage database. The method may further comprise calibrating a model of one or more magnetic dipoles for one or more identified members.

Preferably the step of modelling each identified member as one or more magnetic dipoles comprises moving each identified member to a plurality of positions and taking measurements at those positions. Preferably at least a portion of the positions are predetermined. Measurements may also be taken at random positions.

The method may further comprise identifying joints between the one or more members of working equipment, modelling each identified joint, and including the joint model in the step of modifying the magnetometer measurement.

The method may further comprise determining when the working equipment is stationary, taking a magnetometer measurement, determining the relative position of each identified member, and updating the magnetic dipole model. The step of updating the magnetic dipole model may comprise using a Kalman filter to incrementally update the model.

According to another form, there is provided a system that calibrates a magnetometer or compensates a magnetometer measurement for local disturbances, the system comprising:
    working equipment having one or more members that are movable relative to a magnetometer located on the working equipment; and
    a processor in communication with the magnetometer that is configured to:
        take a magnetometer measurement;
        obtain a magnetic model for at least one of the one or more members;
        determine the position of the one or more modelled members relative to the magnetometer;
        calculate an estimated magnetic disturbance caused by the one or more members using the obtained magnetic model and the determined relative position of each identified member; and
        modify the magnetometer measurement to compensate for local disturbances using the estimated magnetic disturbance.

Preferably the magnetic model is a magnetic dipole model. Preferably the working equipment comprises a chassis and the magnetometer is located on the chassis. Preferably the processor is located on the working equipment. Preferably the processor comprises an embedded system. Preferably the embedded system comprises a microcontroller. Preferably the processor is configured to obtain a magnetic model for a plurality of members that are movable relative to the magnetometer and to determine the position of each of the modelled members.

Preferably the magnetic dipole model comprises an array of dipoles for each member. Preferably the processor is configured to generate a model of each identified member as one or more magnetic dipoles. Preferably the processor is configured to store each generated model. Preferably the processor is configured to retrieve a stored model. When the processor obtains a magnetic dipole model for a member it preferably generates a model or retrieves a stored model for that member.

Preferably the working equipment is an excavator and preferably the one or more members comprise a boom, stick, and/or bucket.

Further features and advantages of the present invention will become apparent from the following detailed description.

BRIEF DESCRIPTION OF THE DRAWINGS

By way of example only, preferred embodiments of the invention will be described more fully hereinafter with reference to the accompanying figures, wherein.

DETAILED DESCRIPTION OF THE DRAWINGS

Figure 1:
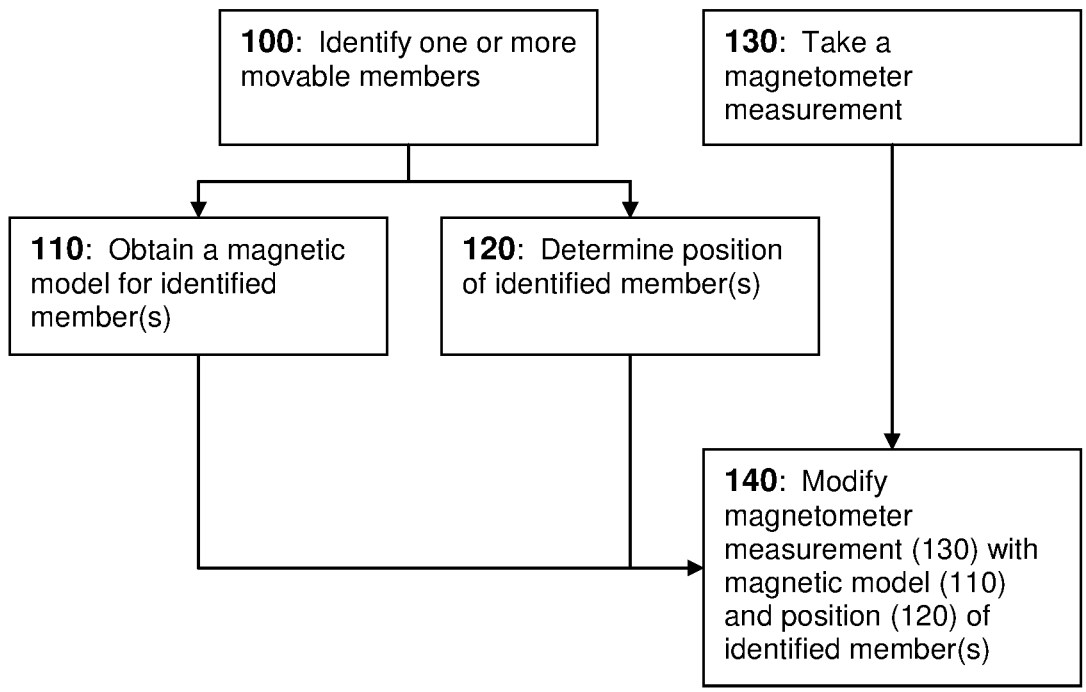
FIG. 1 illustrates a high level flow chart illustrating a method of compensating a magnetometer measurement.
Figure 2:
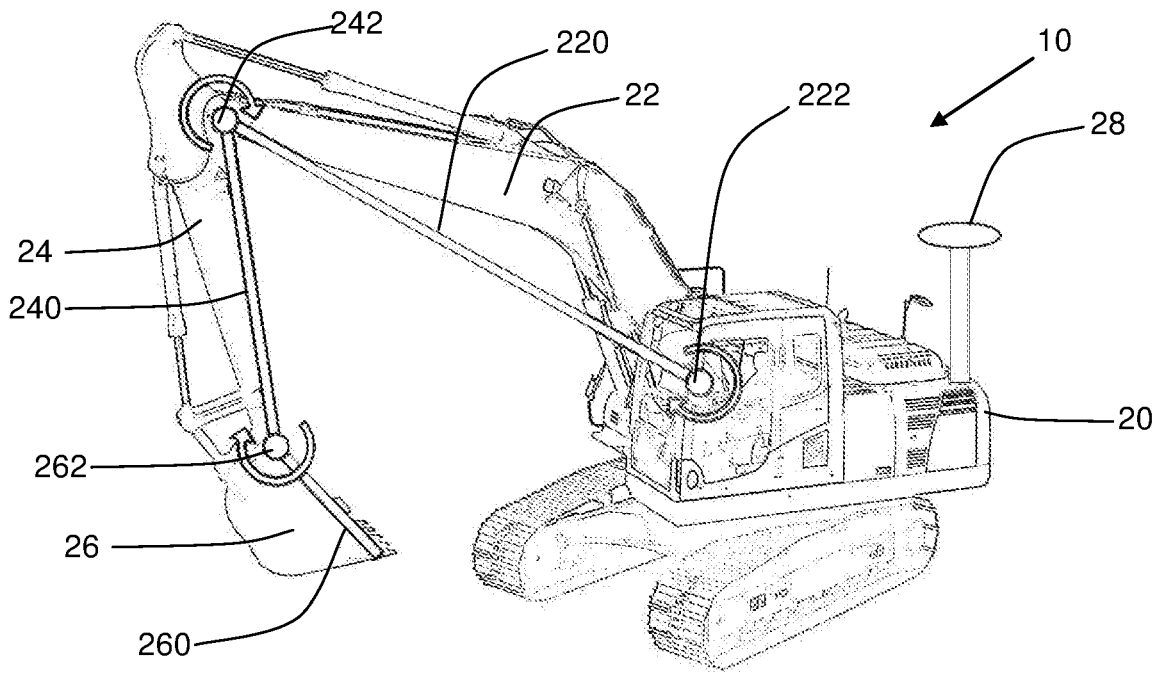
FIG. 2 illustrates a perspective view of an excavator showing a representation of excavator arm geometry.

FIG. 1 illustrates a flow chart of a method of compensating a magnetometer measurement for local magnetic disturbances such as hard iron and soft iron effects. The method is relevant to working equipment with independently movable members, such as an excavator 10 as illustrated in FIG. 2. The invention is primarily described with reference to an excavator 10 but, where the context permits, no limitation is meant thereby and it will be appreciated that the invention could also be applied to other types of equipment and vehicles that use a magnetometer measurement.

In overview, one or more movable members are identified (step 100). Typically the members are ferrous members such as a boom 22, stick 24, and bucket 26 of excavator 10 illustrated in FIG. 2. The boom 22, stick 24, and bucket 26 of excavator 10 illustrated in FIG. 2 are all movable relative to a chassis 20 and to each other. Once identified, a magnetic model is obtained for each member (step 110). The position of each member relative to the magnetometer is also determined (step 120). A magnetometer measurement (step 130) can then be modified using the magnetic model (from step 110) and position data (from step 120) to compensate for magnetic disturbances created by those members. This process will now be described in further detail in relation to the excavator 10 illustrated in FIGS. 2 to 5.

FIG. 2 illustrates an excavator 10 having a boom 22, stick 24, and bucket 26 that are each independently movable relative to a chassis 20. The excavator 10 also has a magnetometer 28 mounted to the chassis. Although the magnetometer 28 is illustrated as being mounted externally on the chassis 20 this is for example only and it will be appreciated that the magnetometer 28 could be placed in a different manner or location such as, for example, internally.

The boom 22 has a reference axis 220 and is movable relative to the chassis 20 by pivoting around boom joint 222. The stick 24 has a reference axis 240 and is movable relative to the boom 22 by pivoting around stick joint 242. The bucket 26 has a reference axis 260 and is movable relative to the stick 24 by pivoting around bucket joint 262. The angle of the boom reference axis 220, the stick reference axis 240, and the bucket reference axis 260, and the boom joint 222, stick join 242, and bucket joint 262 respectively, can be determined using sensors such as, for example, a rotary encoder located at each joint or using an inclinometer or accelerometer associated with each movable member, or the like.

Figure 3:
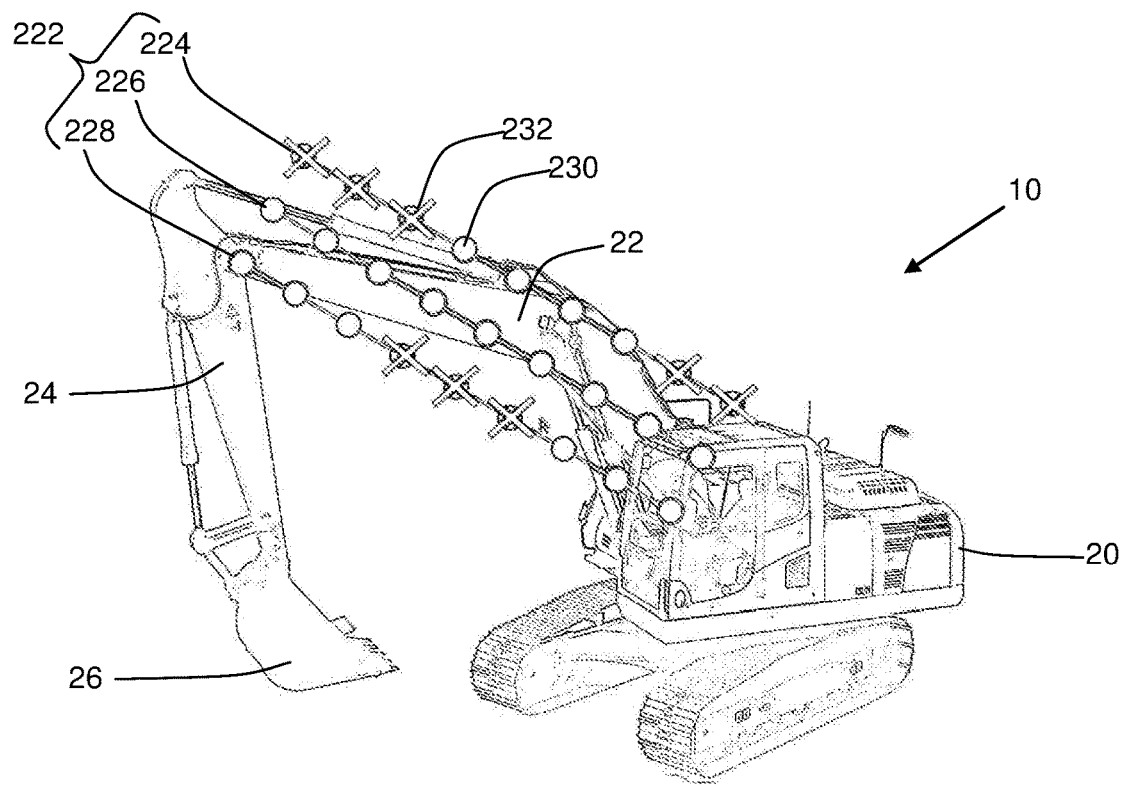
FIG. 3 illustrates the excavator showing the boom modelled as a two dimensional array of dipoles.

FIG. 3 illustrates an example magnetic model in the form of a magnetic dipole model for the boom 22. The example magnetic dipole model for the boom 22 is a 3×9 two dimensional array 222 having 27 elements which each correspond to a magnetic dipole 230. The dipoles are evenly spaced (for convenience) along three rows 224, 226, 228 of the array 222 that are aligned with the boom reference axis 220 (see FIG. 2). It will be appreciated that the 3×9 array 222 is for example only, and that other sized, dimensioned, and spaced arrays could be utilised to provide more or less accurate models with more or less computational power requirements to process.

A magnetic flux density of each magnetic dipole 230 is estimated. Some of the elements are located at a position that does not correspond with relevant portions of the boom 22, such as dipole 232, which results in a zero magnetic flux density. For the remaining non-zero dipoles, the magnetic flux density of each dipole is estimated using physics, such as Maxwell's Equations which are as follows:

$$\nabla \cdot E = \frac{\rho}{\epsilon_0}$$

$$\nabla \cdot B = 0$$

$$\nabla \times E = -\frac{\partial B}{\partial t}$$

$$\nabla \times B = \mu_0 J + \mu_0 \epsilon_0 \frac{\partial E}{\partial t}$$

Of most relevance is the second equation, known as Gauss's Law for Magnetism, and the fourth equation, referred to as Ampere's Law. If a magnetic field varies slowly (when compared to the speed of light), then the time-varying components reduce to zero and the magnetic field equations (B) are decoupled from the electric field components (E). This reduced form of Maxwell's Equations are known as the magnetostatic equations and may be re-written as:

$$\nabla \cdot B = 0$$

$$\nabla \times B = \mu_0 J$$

The magnetostatic equations make the magnetic field B dependent upon the current density J and the permeability of free space $\mu_0$ such that an area of current density gives rise to a magnetic field. If the current area is reduced to an infinitesimally small area whilst retaining the same capacity to perform work (in a physics sense), then a magnetic dipole remains which is characterised by its magnetic moment, m. Solving Maxwell's Equations for a magnetic dipole has a solution in terms of a displacement vector r from the dipole as follows:

$$B = \frac{\mu_0}{4\pi} \frac{3(r \bullet m)r - \|r\|^2 m}{\|r\|^5}$$

For multiple independent current areas, linear superposition can apply such that:

$$B = \sum_{i=1}^{N} B_i$$

Where B is the final magnetic field, $B_i$ is the ith current region, and N is the total number of regions. A single magnetic dipole approximation can be used if the distance to an object is much larger than the size of the object itself. Where a single dipole approximation fails, e.g. for an excavator boom, then the object can be modelled as a set of individual magnetic dipoles. Alternatively, a multi-pole expansion to cover a finite size could be used.

A generic dipole equation, as outlined above, is coordinate free and assumes the origin is centred at the dipole. It does not, however, directly estimate magnetic flux density as observed by a magnetometer.

The magnetometer is located at position $r_{vm}^m$ relative to a vehicle, resolved in the magnetometer's (Cartesian) coordinate system. The displacement of a magnetic dipole, relative to the vehicle is located at $r_{vd}^m$, resolved in the magnetometer frame. Since the dipole equation is valid when at the origin of the dipole and aligned with the dipole frame, the displacement of interest is $r_{dm}^d$, which is the displacement of the magnetometer relative to the dipole, expressed in the dipole frame:

$$r_{dm}^d = r_{vm}^d - r_{vd}^d$$

However, locations of the magnetometer and the dipole are known in the magnetometer frame and there is a known transformation between the magnetometer frame and the dipole frame, so the displacement of interest therefore becomes:

$$r_{dm}^d = R_m^d(r_{vm}^m - r_{vd}^m)$$

The magnetic flux density, resolved in the dipole frame, for a given dipole may therefore be calculated as:

$$B^d = \frac{\mu_0}{4\pi} \frac{3(r_{dm}^d \cdot m)r_{dm}^d - \|r_{dm}^d\|^2 m}{\|r_{dm}^d\|^5}$$

As magnetometer observations are in its own coordinate frame, not the dipole frame, the magnetic field induced on the magnetometer will then be observed as:

$$B^m = R_d^m B^d$$

Letting:

$$r_{dm}^d = [r_x, r_y, r_z]^T$$

then the magnetic flux density may be expressed in matrix form as:

$$B^m = R_d^m A(r_{dm}^d) m$$

where matrix A as a function of $r_{dm}^d$ is expressed as:

$$A(r_{dm}^d) = \frac{\mu_0}{4\pi\|r_{dm}^d\|^5} \begin{bmatrix} 3r_x^2 - \|r_{dm}^d\|^2 & 3r_x r_y & 3r_x r_z \\ 3r_x r_y & 3r_y^2 - \|r_{dm}^d\|^2 & 3r_y r_z \\ 3r_x r_z & 3r_y r_z & 3r_z^2 - \|r_{dm}^d\|^2 \end{bmatrix}$$

As illustrated by the above equation, the magnetic flux density induced by the magnetometer is linear in m, conditioned on the displacement vector in the dipole frame. Accordingly, given a sufficient number of magnetometer observations, a magnetic dipole moment may be estimated using linear methods.

The magnetic effect of the boom 22 of an excavator 10 is more appropriately modelled as multiple dipoles, at least because the distance from the magnetometer 28 to the boom 22 is of the same order of magnitude as the size of the boom. Superposition holds for multiple independent current regions so the total magnetic flux density may be written as the sum of the magnetic flux density induced by each dipole element, i.e.:

$$B^m = \sum_{j=1}^{N} R_{d_j}^m B^{d_j}(r_{d_jm}^d)$$

Where $B^{d_j}(r_{d_jm}^d)$ is the magnetic flux density calculated for the jth dipole as a function of the displacement vector $r_{d_jm}^d$ and $R_{d_j}^m$ is the rotation from the jth dipole frame to the magnetometer frame.

A multiple dipole equation may be written in matrix form, omitting the dependency on the position of the dipole(s) for clarity:

$$B^m = [R_{d_1}^m A_1 \ R_{d_2}^m A_2 \ \ldots \ R_{d_N}^m A_N] \begin{bmatrix} m_1 \\ m_2 \\ \vdots \\ m_N \end{bmatrix}$$

Before compensating for magnetic deflection from the boom 22, the magnetic moment for each dipole element must be estimated. Assuming that a magnetometer 28 is calibrated for the magnetic deflection caused by the chassis 20 and that no other stray magnetic fields are present, then the magnetometer will measure both the Earth's magnetic field $B_0$ and the magnetic deflection due to the movable boom 22, stick 24, and bucket 24, $B^m$, modified by any additive noise $\eta$ as follows:

$$\hat{B}^m = B_0 + B^m + \eta$$

If measurements from multiple magnetometers are taken or, equivalently, from the dipoles taking multiple distinct positions and/or orientations, then the measurement from the kth magnetometer (or dipole displacement) is given by:

$$\hat{B}_k^m = B_0 + B_k^m + \eta_k$$

Rewriting the above equation into matrix form and incorporating the Earth's magnetic field into the state vector, omitting the dependence on position for clarity results in:

$$\begin{bmatrix} \hat{B}_1^m \\ \hat{B}_2^m \\ \vdots \\ \hat{B}_M^m \end{bmatrix} = \begin{bmatrix} R_{d_1}^{m_1} A_{11} & R_{d_2}^{m_1} A_{12} & \ldots & R_{d_N}^{m_1} A_{1N} & I \\ R_{d_1}^{m_2} A_{21} & R_{d_2}^{m_2} A_{22} & \ldots & R_{d_N}^{m_2} A_{2N} & I \\ \vdots & \vdots & \ddots & \vdots & \vdots \\ R_{d_1}^{m_M} A_{M1} & R_{d_2}^{m_M} A_{M2} & \ldots & R_{d_N}^{m_M} A_{MN} & I \end{bmatrix} \begin{bmatrix} m_1 \\ m_2 \\ \vdots \\ m_N \\ B_0 \end{bmatrix} + \begin{bmatrix} \eta_1 \\ \eta_2 \\ \vdots \\ \eta_M \end{bmatrix}$$

As the above system is clearly a linear system, if at least $N+1$ sufficiently diverse magnetometer observations can be measured and recorded then it is possible to recover the magnetic dipole moments for each element (and the constant offset) via linear mathematics techniques. Because of the possibility of stray or transient magnetic fields, robust estimation techniques (e.g. M-estimators) should be considered to reduce the effect of outliers caused by external transient magnetic fields.

The positions of the dipoles within an array may be arbitrary, but for convenience the dipoles are normally spaced uniformly within an array. To calculate the position of each dipole 230 it is assumed that the boom array 222 has l×m×n dipoles (3×9×1 for the example illustrated in FIG. 3), each separated by a displacement vector $d^d$, resolved in the dipole frame which is aligned with the boom reference axis 220. If the displacement of the reference dipole from the origin of the boom frame is denoted $r_{bd_{000}}{}^d$, then the displacement of the i-j-kth element in the boom frame may be calculated as:

$$r_{bd_{ijk}}^d = r_{bd_{000}}^d + \begin{bmatrix} i & 0 & 0 \\ 0 & j & 0 \\ 0 & 0 & k \end{bmatrix} d^d$$

Since the displacement of the boom 22 relative to the vehicle, resolved in the vehicle frame $r_{vb}{}^v$ may be calculated from parameters provided by a guidance system of the excavator 10, and the displacement of the magnetometer 28 relative to the chassis 10 $r_{vm}{}^v$ is also known, then the displacement of the magnetometer relative to the i-j-kth magnetic dipole element, resolved in the dipole frame is given by:

$$r_{d_{ijk}m}{}^d = R_v{}^d r_{vm}{}^v - R_v{}^d r_{vb}{}^v - r_{bd_{ijk}}{}^d$$

Where $r_{bd_{ijk}}{}^d$ is calculated as above, $R_d{}^v$ and $r_{vb}{}^v$ are supplied by a guidance system, and $r_{vm}{}^v$ is known. This information for each magnetic dipole element in relation the boom 22, stick 24, bucket 26, or other movable linkage, is sufficient to formulate a magnetic dipole model for that member as outlined previously.

Figure 4:
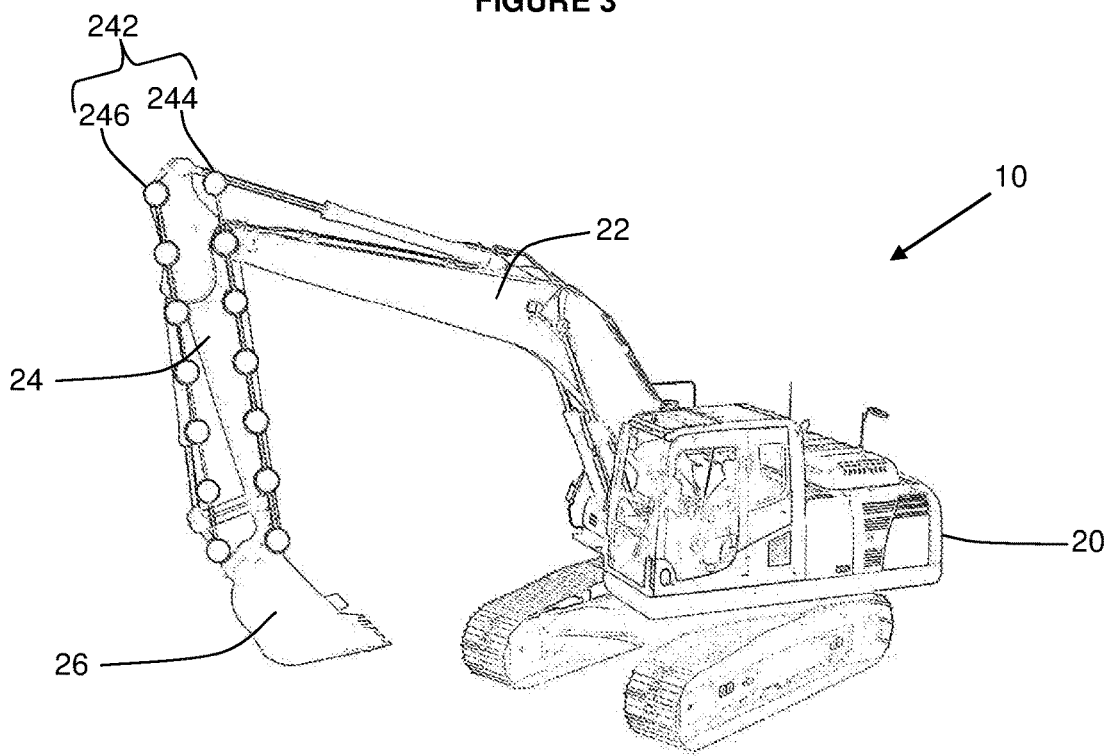
FIG. 4 illustrates the excavator showing the stick modelled as a two dimensional array of dipoles.

FIG. 4 illustrates an example magnetic dipole model for the stick 24 of the excavator 10. The example magnetic dipole model for the stick 24 is a 2×7 two dimensional array 242 having 14 elements which each correspond to a magnetic dipole 230 (see FIG. 3). The dipoles are evenly spaced along two rows 244, 246 of the array 242 that are aligned with the stick reference axis 240 (see FIG. 2). No zero magnetic moment dipoles 232 (see FIG. 3) are present in this example model.

Figure 5:
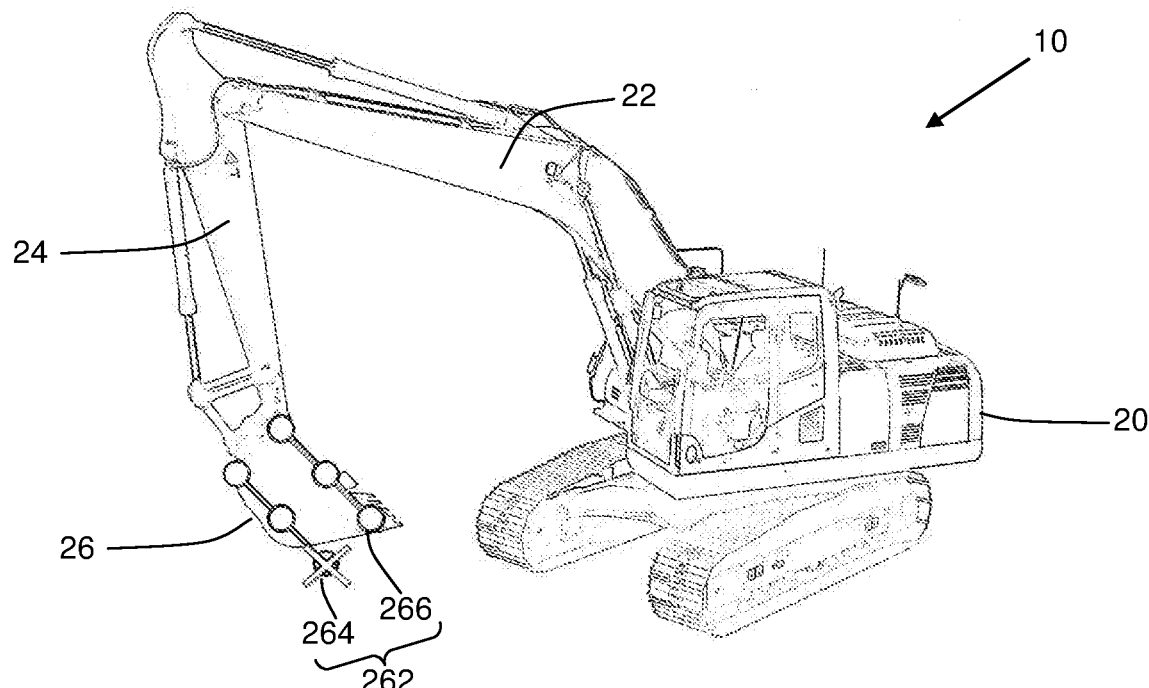
FIG. 5 illustrates the excavator showing the bucket modelled as a two dimensional array of dipoles.

FIG. 5 illustrates an example dipole model for the bucket 26 of the excavator 10. The example magnetic dipole model for the bucket 26 is a 2×3 two dimensional array 262 having 6 elements which each correspond to a magnetic dipole 230 (see FIG. 3). The dipoles are evenly spaced along two rows 264, 266 of the array 262 that are aligned with the bucket reference axis 260 (see FIG. 2). A single zero magnetic moment dipole 232 (see FIG. 3) is present in this example. As the bucket 26 has a substantial lateral dimension it would be more preferable for the bucket model to comprise a three-dimensional array of dipoles. As a substantial portion of the bucket volume is empty space, it is envisaged that such a model would yield multiple dipoles with a magnetic moment vector of zero.

The number of dipoles in a model is not fixed. However, too few dipoles will result in under-fitting and too many dipoles will result in over-fitting. Known statistical tests for under-fitting and over-fitting of linear systems can be utilised to assist in determine a suitable fitting if desired.

A suggested procedure to determine the number and of samples for a vehicle, such as an excavator 10, is to have a three dimensional array of samples spaced at 1 m intervals in each direction required to extend beyond the spatial boundaries of a particular member. For example, if a boom 22 is 8 m×3 m×0.7 m then an array of 9×4×2 could be selected such that the boom 22 fits within the spatial limits of the array.

If it is determined that there is under-fitting or over-fitting, then the density of the array can be increased or decreased, respectively, as necessary. Any elements which have a strong probability of their magnetic moment being zero can be eliminated and the remaining elements re-fitted. Any spare computational resources can be utilised to search for better model configurations, even while the working equipment is operating if desired.

To generate magnetic models for the members for the first time a number of magnetometer measurements, with different member positions, are required. Once a magnetic model has been generated for a member, it can be obtained by retrieving a stored model instead of generating a fresh model. However, it may be desirable to regenerate a model from time to time to ensure that it remains accurate.

The minimum number of magnetometer samples needed to generate or recalibrate a model is one more than the number of magnetic dipoles that are being estimated to cater for a constant offset and ambient magnetic field. Preferably, however, a large and spatially diverse set of samples is utilised to generate the magnetic dipole model as it generally results in a more accurate model. Even more preferably, a plurality of samples are taken over substantially the entire movement range of the movable members, i.e. the boom 22, stick 24, and bucket 26 in relation to the excavator 10.

A suggested movement procedure to obtain a diverse set of magnetometer measurements that result in a reliable, high quality magnetic dipole model for the excavator 10 illustrated in FIGS. 2 to 5 is as follows:
1. move the boom 22, stick 24, and bucket 26 to as far as can be reached;
2. rotate the bucket 26 to its limits;
3. sweep the stick 24 towards to chassis 20 and rotate the bucket 26 whilst the stick 24 is being moved;
4. once the stick 24 is as close to the chassis as is considered safe, rotate the bucket 26 as high as it will go;
5. sweep the stick 24 to a position far from the chassis 20;
6. raise the boom 22 by a small amount (e.g. 15°) and repeat steps 2 to 5 until the boom 22 is in its highest position; and
7. once the boom 22 is in the highest position, and the stick 24 is as close to the chassis 20 as is considered safe, reverse the procedure in steps 2 to 6.

While such a procedure will yield a large and diverse sample, it is for example only. The procedure may be truncated or randomly positioned samples can be used if it can be determined that there is sufficient diversity in the samples to provide a suitably accurate estimate of the dipole moments. A covariance matrix of a recursive least-squares formulation may be determined to yield information on the quality of the fit of a model.

Once the magnetic models have been obtained, whether it is by retrieving a stored model or by generating a new one, the magnetic model information for a member can be utilised, together with a determined position of the member, to modify a magnetometer measurement to compensate for local disturbances caused by the movable members. A magnetometer measurement $\hat{B}^m$ is taken, which may include factory compensation and/or compensation for fixed vehicle effects, and a compensated magnetometer measurement $\tilde{B}_0$, which follows directly from magnetic flux density induced by multiple magnetic dipoles of the models, is subsequently determined by:

$$\tilde{B}_0 = \hat{B}^m - \sum_{j=1}^{N} R_{d_j}^m B^{d_j}(r_{d_jm}^d)$$

This compensation calculation consists of little more than N 3×3 matrix-vector multiplications which means it is relatively fast to execute and within the computational resources available on a modern low-cost microcontroller of an embedded system.

If working equipment, such as the excavator 10, is determined to be stationary for a predetermined period of time, then the magnetic dipole model may be updated in real-time. Such updates may be achieved using a linear Kalman filter, or related estimators such as an information filter. Drift in the magnetic dipoles can be modelled as a random walk or any other suitable stochastic model (e.g. Gauss-Markov).

The measurement model follows directly from the magnetometer measurement and the position of the movable members when the measurement was taken. An additional state for a constant may need to be introduced for a given heading. A Kalman Filter can therefore be implemented to incrementally update a magnetic dipole model from measurements after checking the consistency of the measurements to prevent any bad matches that may occur.

The boom joint 222, stick joint 242, and bucket joint 262 may require separate consideration as they can contain considerable quantities of metal which may affect magnetometer measurements. For the boom joint 222, the boom 22 rotates about a lateral axis of the chassis 20 of the excavator 10, denoted as the y-axis. Since the magnetic moment always points in the same direction relative to the magnetometer, and its position does not change relative to the magnetometer, the contribution of the boom joint 222 to the total magnetic flux of the excavator 10 cannot be distinguished from the fixed offset. Therefore, the moment about the y-axis is not observable in its own right.

Turning to the stick joint 242 and the bucket joint 262, since they only have only one rotational degree of freedom about the y-axis then the y-components for each member connected to the joint will always lie in the same position and angle relative to the magnetometer 28, regardless of the position of the joint relative to the excavator 10. Since the contribution from the y-axis of each arm at the joint cannot be distinguished, they cannot be estimated separately.

The stick joint 242 and the bucket joint 262 cannot be considered entirely separately as the model will be rank deficient. The x-axis and z-axis components may be modelled independently as observability is obtained via the relative rotation of the two joints. However, since the y-axis of the two joints remain parallel, magnetic moment of one joint can remain un-modelled and its contribution subsumed into the remaining dipole. Alternatively, a 'pseudo-measurement' may be added to the model, with zero noise, that forces the component to be estimate as zero, i.e.

$$b_{s,y} = 0 = [0 \ldots 1 \ldots 0] \begin{bmatrix} m_1 \\ \vdots \\ m_{s,y} \\ \vdots \\ m_N \end{bmatrix}$$

Constrained least squares and similar formulations may also be used to achieve the same result.

Additional linkages, such as a second boom or a rototilt bucket are straightforward extensions with generation of a magnetic model and compensation of a magnetometer measurement being implemented in the same manner. Since a guidance system must be aware of the position and orientation of additional linkages, a set of magnetic dipoles for any such additional linkages can be generated in the appropriate coordinate system. Accordingly, the position and orientation of the new dipoles are known and thus may be incorporated as described previously.

Figure 6:
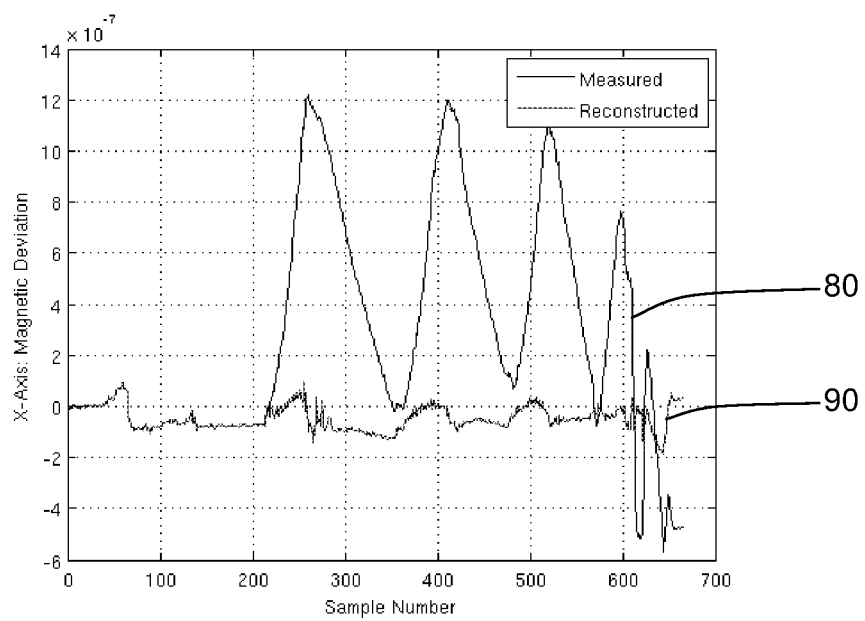
FIG. 6 illustrates a plot of actual measured and reconstructed x-axis magnetic deviation of an excavator (before and after compensation, respectively)
Figure 7:
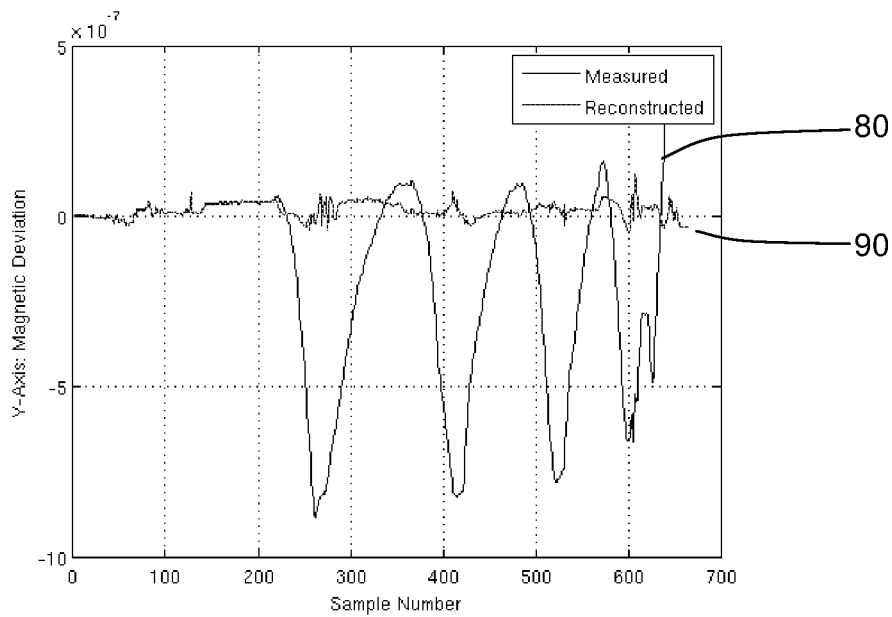
FIG. 7 illustrates a second plot of actual measured and reconstructed y-axis magnetic deviation of an excavator (before and after compensation, respectively)
Figure 8:
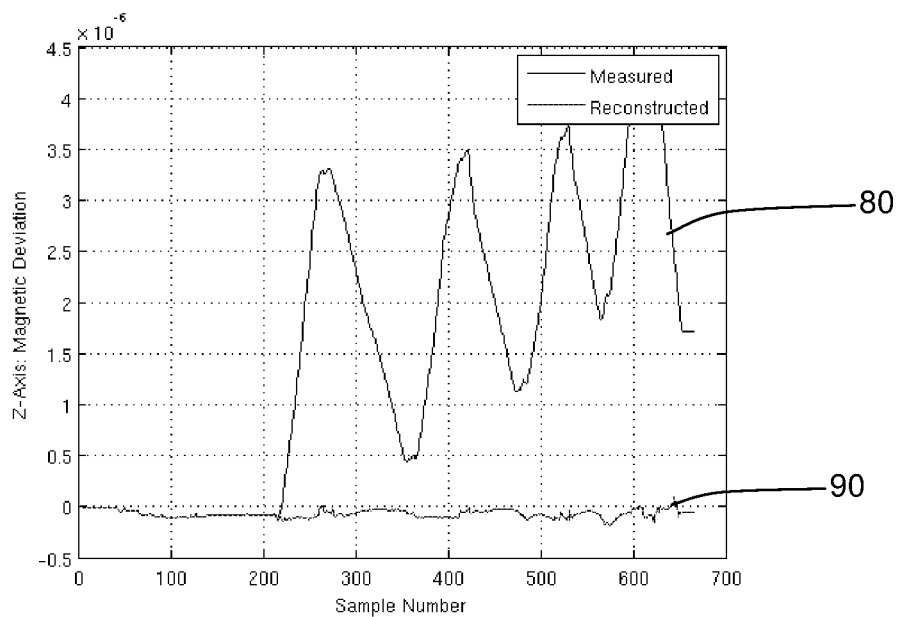
FIG. 8 illustrates a third plot of actual measured and reconstructed z-axis magnetic deviation of an excavator (before and after compensation, respectively).

FIGS. 6 to 8 illustrate actual test results that demonstrate the efficacy of the method and system in relation to an excavator 10. Two plots are compared, first a measured magnetic deflection 80 and second a reconstructed magnetic deflection 90 which is compensated as per the method and system.

For clarity, a constant component representing the ambient magnetic field and fixed offsets has been removed. In all instances, the vertical axis units are in Teslas (T). For comparison, the magnitude of the Earth's magnetic field at the test location is approximately 50 μT. The horizontal axis represents the index of the sample collected.

The test procedure was performed with the boom 22 being swept forwards and backwards, resulting in a distinct 'sawtooth' pattern that is evident in the measured magnetic deviation plots in FIGS. 6 to 8. At the end of each boom 22 movement, the stick 24 and bucket 26 was moved forwards and backwards and at the end of the entire sequence the bucket 26 was very close to the chassis 20, resulting in a distinct set of 'dips' that can be seen after sample 600.

As can be seen from the minor magnetic deviation in the compensated measurements, magnetic influences from the boom 22, stick 24, and bucket 26 were substantially corrected. The bucket 26, in this instance, was a tilt bucket and therefore two rotational degrees of freedom were taken into account. The magnitude of the maximum deviation on the x-axis magnetometer has been reduced from 1.2 μT to under 0.2 μT. This represents a reduction in a maximum heading error from 1.76° to under 0.3°. Even better results can be observed for the y-axis and z-axis magnetometers. In particular, the largest deviation observed in the z-axis is almost 4 μT, which has been reduced by more than an order of magnitude to well under 0.3 μT.

Advantageously the invention significantly reduces magnetometer errors induced by local disturbances of movable members, such as from a boom 22, stick 24, and bucket 26 of an excavator 10. Compensation of the magnetometer measurements is performed readily on embedded systems such as microcontroller based systems located on working equipment. The compensated magnetometer measurements can then provide significantly improved heading information with less error in lower cost, more commercially competitive systems than would otherwise be possible.

Furthermore, once a model has been generated for a member it can be stored and loaded if desired. For working equipment which changes implements, such as an excavator changing buckets, this enables the excavator to readily load a model for the current bucket being utilised. The model for each member can be associated with a unique identifier, such as a serial number, making identification and retrieval of the correct model for a member relatively straight forward with little or no operator input.

Additionally, the magnetic model for a given implement may be determined on one machine, before being transferred to second machine. The second machine may retrieve and utilise the magnetic model for said implement without the need for further calibration.

In this specification, adjectives such as first and second, left and right, top and bottom, and the like may be used solely to distinguish one element or action from another element or action without necessarily requiring or implying any actual such relationship or order. Where the context permits, reference to an integer or a component or step (or the like) is not to be interpreted as being limited to only one of that integer, component, or step, but rather could be one or more of that integer, component, or step etc.

The above description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. The invention is intended to embrace all alternatives, modifications, and variations of the present invention that have been discussed herein, and other embodiments that fall within the spirit and scope of the above described invention.

In this specification, the terms 'comprises', 'comprising', 'includes', 'including', or similar terms are intended to mean a non-exclusive inclusion, such that a method, system or apparatus that comprises a list of elements does not include those elements solely, but may well include other elements not listed.

The invention claimed is:

1. A method of providing calibration or compensation for a magnetometer located on a chassis of a construction vehicle, mining vehicle, or excavator, the method comprising:
   identifying one or more members, including a boom, stick, or bucket, of the vehicle or excavator that are movable relative to the magnetometer located on the chassis;
   obtaining a magnetic model of each identified member, wherein the magnetic model comprises an array of one or more magnetic dipoles;
   determining a relative position of each identified member;
   taking a magnetometer measurement;
   calculating an estimated magnetic disturbance caused by the one or more members using the magnetic model and relative position of each identified member; and
   modifying the magnetometer measurement according to the estimated magnetic disturbance.

2. The method of claim 1, wherein: each array is at least two dimensional; or
   each array varies relative to the other arrays; or
   the spacing between magnetic dipoles within an array varies; or
   the array of magnetic dipoles is aligned along a reference axis relative to the identified member; or
   the size of the array of magnetic dipoles for each identified member is determined to prevent under-fitting or over fitting.

3. The method of claim 2, wherein;
   the reference axis corresponds to a longitudinal axis or major axis of the identified member; or
   the reference axis is selected to maximize the number of elements of an array that correspond to a position of the identified member.

4. The method of claim 1, further comprising the step of determining the fitting of each array by examining a covariance matrix of a recursive least-squares formulation of an array.

5. The method of claim 4, further comprising increasing the number of elements in the array if under-fitting is determined and decreasing the number of elements in the array if over-fitting is determined.

6. The method of claim 1, wherein;
   each element of an array relates to a co-ordinate of the corresponding identified member of that array; or
   each magnetic dipole has a fixed displacement relative to the co-ordinates of its identified member.

7. The method of claim 1, wherein the step of determining the relative position of each identified member comprises determining the relative position of each magnetic dipole of the identified member.

8. The method of claim 1, wherein the step of modelling each identified member as one or more magnetic dipoles comprises one or more of the following:
   estimating a magnetic flux density or
   a magnetic moment of each magnetic dipole.

9. The method of claim 6, wherein once an identified member has been modelled as one or more magnetic dipoles, a model for that identified member is stored and the method further comprises the step of storing a model of an identified member together with an identifying element that corresponds to that identified member.

10. The method of claim 6, wherein the step of modelling each identified member as one or more magnetic dipoles comprises moving each identified member to a plurality of positions and taking measurements at those positions.

11. The method of claim 1, further comprising identifying joints between the one or more members of the vehicle, modelling each identified joint, and including the joint models in the step of modifying the magnetometer measurement.

12. The method of claim 1, further comprising determining when the vehicle is stationary, taking a magnetometer measurement, determining the relative position of each identified member, and incrementally updating the magnetic dipole model using a Kalman filter.

13. The method of claim 1, wherein the step of obtaining a magnetic model of each identified member comprises generating the magnetic model or retrieving the magnetic model, and
   wherein generating the magnetic model comprises:
   moving the one or more members to a plurality of positions;
   determining the relative position of each identified member at each of the plurality of positions;
   taking a magnetometer measurement at each of the plurality of positions; and
   calculating a magnetic model from the relative positions and magnetometer measurements at those positions.

14. The method of claim 2, wherein;
   the reference axis corresponds to a longitudinal axis or major axis of the member; and
   the reference axis is selected to maximize the number of elements of an array that correspond to a position of the member.

15. The method of claim 1, wherein;
   each element of the array relates to a co-ordinate of the corresponding identified member of that array; and
   each magnetic dipole has a fixed displacement relative to the co-ordinates of its identified member.

16. A system that calibrates a magnetometer or compensates a magnetometer measurement for local disturbances, the system comprising:
   a construction vehicle, mining vehicle, or excavator, having one or more members, including a boom, stick, or bucket, that are movable relative to a magnetometer located on a chassis the vehicle or excavator; and
   a processor in communication with the magnetometer that is configured to:

take a magnetometer measurement;
obtain a magnetic model for at least one of the one or more members, wherein the magnetic model comprises an array of one or more magnetic dipoles;
determine a position of the one or more modelled members relative to the magnetometer;
calculate an estimated magnetic disturbance caused by the one or more members using the obtained magnetic model and the determined relative position of each identified member; and
modify the magnetometer measurement to compensate for local disturbances using the estimated magnetic disturbance.

17. A method of providing calibration or compensation for a magnetometer located on a chassis of a construction vehicle, mining vehicle, or excavator, the method comprising:
providing a system that calibrates a magnetometer or compensates a magnetometer measurement for local disturbances;
identifying one or more members, including a boom, stick, or bucket, of the vehicle or excavator that are movable relative to the magnetometer located on the chassis;
obtaining a magnetic model of each identified member, wherein the magnetic model comprises an array of one or more magnetic dipoles;
determining a relative position of each identified member;
taking a magnetometer measurement;
calculating an estimated magnetic disturbance caused by the one or more members using the magnetic model and relative position of each identified member; and
modifying the magnetometer measurement according to the estimated magnetic disturbance,
wherein the system comprises:
a construction vehicle, mining vehicle, or excavator, having one or more members, including a boom, stick, or bucket, that are movable relative to a magnetometer located on a chassis the vehicle or excavator; and
a processor in communication with the magnetometer that is configured to:
take a magnetometer measurement;
obtain a magnetic model for at least one of the one or more members, wherein the magnetic model comprises an array of one or more magnetic dipoles;
determine a position of the one or more modelled members relative to the magnetometer;
calculate an estimated magnetic disturbance caused by the one or more members using the obtained magnetic model and the determined relative position of each identified member; and
modify the magnetometer measurement to compensate for local disturbances using the estimated magnetic disturbance.

* * * * *